US012635148B2

(12) United States Patent
Castro et al.

(10) Patent No.: US 12,635,148 B2
(45) Date of Patent: May 19, 2026

(54) SEMICONDUCTOR DIE STACKS AND ASSOCIATED SYSTEMS AND METHODS

(71) Applicant: Micron Technology, Inc., Boise, ID (US)

(72) Inventors: Hernan A. Castro, Shingle Springs, CA (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 456 days.

(21) Appl. No.: 18/111,287

(22) Filed: Feb. 17, 2023

(65) Prior Publication Data

US 2023/0284465 A1     Sep. 7, 2023

Related U.S. Application Data

(60) Provisional application No. 63/315,809, filed on Mar. 2, 2022.

(51) Int. Cl.
| | |
|---|---|
| *H10B 80/00* | (2026.01) |
| *H01L 23/00* | (2006.01) |
| *H01L 23/48* | (2006.01) |

(52) U.S. Cl.
CPC ........... *H10B 80/00* (2023.02); *H01L 23/481* (2013.01); *H01L 24/08* (2013.01); *H01L 24/80* (2013.01);
(Continued)

(58) Field of Classification Search
CPC ....... H01L 23/481; H01L 24/08; H01L 24/80; H01L 24/94; H01L 24/05;
(Continued)

(56) References Cited

U.S. PATENT DOCUMENTS

| | | | |
|---|---|---|---|
| 10,665,580 B1 * | 5/2020 | Hosoda | ............... H01L 25/0657 |
| 11,562,975 B2 * | 1/2023 | Hou | ........................ H01L 24/17 |

(Continued)

FOREIGN PATENT DOCUMENTS

| | | | |
|---|---|---|---|
| KR | 20210154829 A | * 12/2021 | ............. H01L 25/50 |

OTHER PUBLICATIONS

U.S. Appl. No. 18/111,266—Unpublished Patent Application to Kunal R. Parekh et al., filed Feb. 17, 2023, titled "Semiconductor Memory Dies Bonded to Logic Dies and Associated Systems and Methods", 39 pages.

*Primary Examiner* — Mamadou L Diallo
(74) *Attorney, Agent, or Firm* — Dorsey & Whitney LLP

(57) ABSTRACT

Semiconductor die stacks and associated systems and methods are disclosed. In an embodiment, a semiconductor die stack corresponds to a pair of a logic die and a memory die directly bonded together. The logic die includes integrated circuits generated by relatively high temperature process steps whereas the memory die includes memory cells with materials generated using relatively low temperature process steps. A logic wafer including the logic dies and a memory wafer including the memory dies are separately fabricated. Subsequently, the logic wafer and the memory wafer are directly bonded to generate the semiconductor die stacks. Either the logic dies or the memory dies include through-substrate vias (TSVs) to provide power and signals for the semiconductor die stacks. The resulting semiconductor devices operate as a single device as if they were formed in a monolithic substrate.

16 Claims, 9 Drawing Sheets

100A

100B

100C

(52) U.S. Cl.

CPC .............. *H01L 24/94* (2013.01); *H01L 24/05* (2013.01); *H01L 2224/05647* (2013.01); *H01L 2224/05686* (2013.01); *H01L 2224/08146* (2013.01); *H01L 2224/80379* (2013.01); *H01L 2224/80895* (2013.01); *H01L 2224/80896* (2013.01); *H01L 2224/94* (2013.01)

(58) Field of Classification Search

CPC . H01L 2224/05647; H01L 2224/08146; H01L 2224/80895; H01L 2224/80896; H01L 2224/80001; H01L 21/76898; H01L 2224/94; H01L 25/16; H01L 23/3107; H10B 80/00

See application file for complete search history.

(56) References Cited

U.S. PATENT DOCUMENTS

| | | | |
|---|---|---|---|
| 11,830,844 B2* | 11/2023 | Yu ........................... | H01L 24/19 |
| 2021/0091064 A1* | 3/2021 | Chen ....................... | H01L 24/96 |
| 2022/0028846 A1* | 1/2022 | Alsmeier ............... | H01L 25/18 |
| 2024/0090217 A1* | 3/2024 | Nabesaka .............. | H10B 43/27 |

* cited by examiner

100A

100B

100C

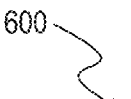

600

Provide a first wafer including a plurality of first semiconductor dies, each of the first semiconductor dies including a plurality of first conductive components on a front side of the first wafer, the plurality of first conductive components coupled to the first circuitry — 610

Provide a second wafer including a plurality of second semiconductor dies, each of the second semiconductor dies including a plurality of second conductive components on a front side of the second wafer, the plurality of second conductive components coupled to the second circuitry — 615

Bond the first wafer to the second wafer to form a bonding interface therebetween, where each of the first conductive components is conjoined to a corresponding one of the second conductive components at the bonding interface, and each of the first semiconductor dies includes a plurality of through-substrate vias (TSVs) connected to the plurality of first conductive components such that both the first circuitry and the second circuitry are coupled to a plurality of bond pads on a back side of each of the first semiconductor die through the plurality of TSVs — 620

*Figure 6*

SEMICONDUCTOR DIE STACKS AND ASSOCIATED SYSTEMS AND METHODS

CROSS-REFERENCE TO RELATED APPLICATIONS

The present application claims priority to U.S. Provisional Patent Application No. 63/315,809, filed Mar. 2, 2022, the disclosure of which is incorporated herein by reference in its entirety.

This application contains subject matter related to a U.S. Provisional Patent Application by Kunal R. Parekh et al. titled "SEMICONDUCTOR MEMORY DIES BONDED TO LOGIC DIES AND ASSOCIATED SYSTEMS AND METHODS." The related application is assigned to Micron Technology, Inc., and is identified as U.S. Provisional Patent Application No. 63/315,789, filed on Mar. 2, 2022. The subject matter thereof is incorporated herein by reference thereto.

TECHNICAL FIELD

The present disclosure generally relates to semiconductor device assemblies, and more particularly relates to semiconductor die stacks and associated systems and methods.

BACKGROUND

Semiconductor packages typically include one or more semiconductor dies (e.g., memory chips, microprocessor chip, imager chip) mounted on a package substrate and encased in a protective covering. The semiconductor die may include functional features, such as memory cells, processor circuits, or imager devices, as well as bond pads electrically connected to the functional features. The bond pads can be electrically connected to corresponding conductive structures of the package substrate, which may be coupled to terminals outside the protective covering such that the semiconductor die can be connected to higher level circuitry.

In some semiconductor packages, two or more semiconductor dies are stacked on top of each other to reduce the footprint of the semiconductor packages. The semiconductor dies in the stack may be arranged in a pattern resembling stair-steps (which may be referred to as "shingle stacking") such that a portion of the semiconductor dies may be freely accessible—e.g., to attach bond wires to one or more bond pads located in the portion. In some cases, the semiconductor dies may be stacked in a "zig-zag" pattern to increase a space above the bond pads with respect to a semiconductor die overlying above the bond pads so as to facilitate forming the bond wires. Such arrangements, however, tend to increase overall heights of the semiconductor packages. Further, the bond wires may add to the heights and/or introduce delays in signal propagation.

BRIEF DESCRIPTION OF THE DRAWINGS

Many aspects of the present technology can be better understood with reference to the following drawings. The components in the drawings are not necessarily to scale. Instead, emphasis is placed on clearly illustrating the overall features and the principles of the present technology.

FIG. 6 is a flowchart of a method of forming semiconductor die assemblies in accordance with embodiments of the present technology.

DETAILED DESCRIPTION

Figure 1:
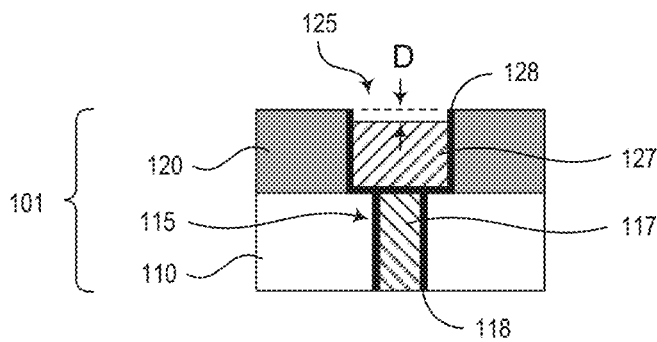
FIG. 1 illustrates various stages of process steps for direct bonding schemes.
Figure 1:
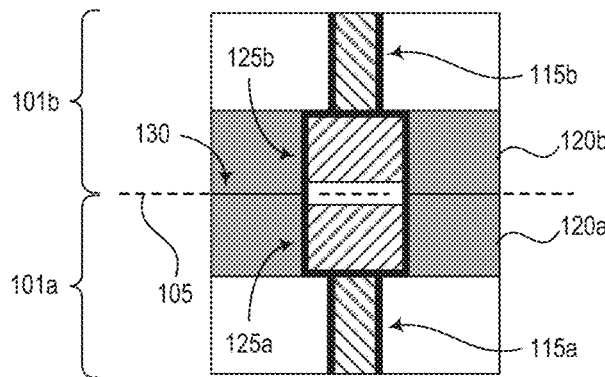
Figure 1:
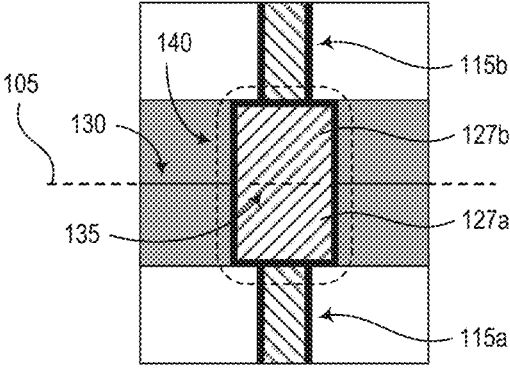

Specific details of several embodiments of semiconductor die stacks and associated systems and methods are described below. The term "semiconductor device or die" generally refers to a solid-state device that includes one or more semiconductor materials. Examples of semiconductor devices (or dies) include logic devices or dies, memory devices or dies, controllers, or processors (e.g., central processing unit (CPU), graphics processing unit (GPU)), among others. The semiconductor devices may include integrated circuits or components, data storage elements (memory cells), information processing components, and/or other features manufactured on semiconductor substrates.

Further, the term "semiconductor device or die" can refer to a finished device or to an assembly or other structure at various stages of processing before becoming a finished functional device. Depending upon the context in which it is used, the term "substrate" may include a semiconductor wafer, a package substrate, a semiconductor device or die, or the like. Suitable steps of the methods described herein can be performed with processing steps associated with fabricating semiconductor devices (wafer-level and/or die-level) and/or manufacturing semiconductor packages.

Semiconductor process technology generally includes wide variety of process steps, process conditions, and materials for generating semiconductor devices. Certain structures of the device (e.g., logic circuits configured to perform a variety of logic functions) are fabricated using process steps with relatively high temperature—e.g., approximately 600 degrees Celsius (° C.) or higher. For example, the logic circuits may include a silicide, an epitaxial layer, or a semiconductor junction with a junction depth greater than 0.1 micrometers (μm), those which require process steps with temperature ranging from approximately 600° C. to 1000° C. or even higher. In some embodiments, the logic circuits include high-power analog circuitry.

On the other hand, certain structures of the devices (e.g., memory cells configured to store information) are fabricated using process steps with relatively low temperature—e.g., typically less than 600° C. For example, phase change memory (PCM) cells may include a chalcogenide compound formed at around 400° C. as a data storage structure. Cell capacitors of dynamic random access memory (DRAM) cells may include a high-k dielectric material with a dielectric constant greater than that of silicon dioxide ($SiO_2$), which are typically formed below 600° C. Also, Not-AND (NAND) memory cells may include the high-k dielectric material as a charge retention layer (e.g., a charge trapping layer) or as an interface material (e.g., an inter-polysilicon dielectric (IPD) layer). The high-k dielectric material may include an oxide or a silicate having one of aluminum, hafnium, zirconium, or lanthanum, among others.

The foregoing materials (low-temperature regime materials) formed at the relatively low temperature play critical roles for the memory cells but tend to lose their desired characteristics if they are subject to the relatively high temperature described above. In some instances, fundamental physical characteristics of the low-temperature regime materials can be destroyed upon receiving the thermal energy associated with the high temperature process steps—e.g., the chalcogenide compound no longer switching back-and-forth between low and high resistance states.

In other instances, the desired physical characteristics of the low-temperature regime materials may be deteriorated upon receiving the thermal energy due to interactions with other materials—e.g., the high-k dielectric materials inter-mixed with adjacent materials resulting in reduced dielectric constant values. In some cases, if the low-temperature regime materials experience the relatively high temperature, the memory cells may become non-functional. In other cases, the memory cell characteristics may deteriorate upon having their low-temperature regime materials experiencing the relatively high temperature—e.g., the memory cells with shortened charge/data retention, degraded cycling performance, increased disturb behavior, among others.

Consequently, if the logic circuits and the memory cells were to be integrated on a single substrate (or a single wafer), the temperature sensitivity of the memory cell materials would require the logic circuits to be completed prior to forming the memory cells so as to avoid adverse effects of the process steps done at the relatively high temperature. Such requirements restrict the overall integration schemes for optimizing performance of the logic circuits and the memory cells independent of each other.

It would be desirable to fabricate semiconductor devices separately in two or more temperature regimes such that process conditions can be optimized for the desired electrical characteristics of the semiconductor devices independent of each other—e.g., a low-temperature regime for memory cells and a high-temperature regime for logic circuits. Subsequently, the semiconductor devices fabricated in different temperature regimes can be brought together such that they can function as a single device as if they are formed in a monolithic substrate. In some embodiments, the semiconductor devices can be brought together (e.g., bonded, attached) at the wafer level (e.g., wafer-to-wafer bonding), at the die level (e.g., die-to-die bonding), or at a mixed level (e.g., die-to-wafer bonding). In some embodiments, a direct bonding scheme is used to combine two or more semiconductor dies.

The direct bonding scheme includes individual conductive components (e.g., copper pads, conductive pads, bond pads) of a first semiconductor die (or a first wafer including the first semiconductor die) aligned and directly bonded to corresponding one of conductive components of a second semiconductor die (or a second wafer including the second semiconductor die). Further, a dielectric material surrounding each of the conductive components of the first semiconductor die can be directly bonded to another dielectric material surrounding each of the conductive components of the second semiconductor die. In other words, the bonding interface includes two or more dissimilar materials of the first semiconductor die directly bonded to corresponding materials of the second semiconductor die (e.g., between dielectric materials, between conductive materials) to form interconnects and surrounding dielectric layers. As such, the direct bonding scheme may also be referred to a combination bonding scheme, a hybrid bonding scheme, or the like.

In some embodiments, the conductive materials include copper (or other suitable conductive materials or metals, such as tungsten) as a primary constituent, and the dielectric materials include silicon oxides (e.g., $SiO_2$), silicon nitrides (e.g., $Si_3N_4$), silicon carbon nitrides (e.g., SiCN), silicon carbonates (e.g., SiCO), or the like. During the direct bonding process, the dielectric materials of the first and second semiconductor dies (or the first and second wafers including the first and second semiconductor dies) are brought together such that the dielectric materials adhere to each other and hermetically seal the conductive components aligned to each other.

Subsequently, the semiconductor dies (or the semiconductor wafers) are annealed at an elevated temperature (e.g., post bond annealing) such that the conductive materials of the conductive components can expand—e.g., swell vertically toward the bonding interface at least partially due to the differences in coefficients of thermal expansion (CTE) between the conductive materials and the dielectric materials. Eventually, the conductive materials are conjoined (e.g., fused) to form permanent bonding—e.g., metallurgical bonding. Additionally, the dielectric materials may enhance their bonding strength during the post bond annealing process.

The present technology facilitates forming of structures that join (integrate, combine) two different semiconductor dies (e.g., memory dies and logic dies), which have been fabricated using process steps including at least two different temperature regimes (e.g., a high temperature regime and a low temperature regime), respectively. The combined (conjoined, integrated, stacked) semiconductor dies (e.g., a memory die bonded to or stacked with a logic die) forms a semiconductor device that includes some shared circuits and/or components between them, as well as unique memory cells and analog and digital circuits that are separately fabricated in two different wafers and process steps. In some embodiments, the resulting semiconductor device performs artificial intelligence (AI) tasks. In some embodiments, the resulting semiconductor device forms an artificial neural network (or a portion thereof) including artificial synapses of artificial neurons included in the memory dies supported by logic functions performed by the logic dies. In some cases, the logic die may perform various analog or digital operations, such as summation, multiplication, comparison, or a combination thereof.

As described in greater details herein, the semiconductor dies (or wafers) can be stacked on top of each other (or bonded to each other) with their front sides of the semiconductor dies (or wafers) facing each other. Typically, the conductive components for making external connections to the semiconductor dies are located on the front sides. As such, the semiconductor dies, once bonded to each other, may need electrical pathways to the conjoined conductive components at the bonding interface such that power and signals can be provided to both of the semiconductor dies.

The present technology facilitates forming of such pathways using through-substrate vias (TSVs). In some embodiments, one of the dies (or wafers) includes TSVs formed prior to the bonding process—e.g., a TSV-first scheme. In some embodiments, TSVs are formed in one of the dies (or wafers) after the bonding process—e.g., a TSV-last scheme. As the TSVs are connected to the conjoined conductive components of both semiconductor dies at the bonding interface, power and signals can be provided to both semiconductor dies through the TSVs.

Moreover, the present technology is expected to improve the time it takes to move data back-and-forth between the memory cells and the logic die in view of the direct bonding scheme that reduces distance between them, thereby improving performance and power use of the resulting semiconductor device. Additionally, or alternatively, the resulting semiconductor devices are expected to improve form factors of the semiconductor die assemblies including them enabling new applications and improving efficiency.

As used herein, the terms "front," "back," "vertical," "lateral," "down," "up," "top," "bottom," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations. Unless stated otherwise, terms such as "first" and "second" are used to arbitrarily distinguish between the elements such terms describe. Thus, these terms are not necessarily intended to indicate temporal or other prioritization of such elements.

FIG. 1 including diagrams 100A through 100C illustrates various stages of process steps for direct bonding schemes. Diagram 100A illustrates a portion of a semiconductor die 101 with a substrate 110 having integrated circuitry (not shown) and a through-substrate via (TSV) 115 coupled with the integrated circuitry. In some embodiments, the TSV 115 includes a first conductive material 117 (e.g., tungsten) and a conductive barrier layer 118 (e.g., TiN). The semiconductor die 101 also includes a conductive pad 125 (which may also be referred to as a bond pad) formed in a dielectric layer 120 (e.g., silicon oxides, silicon nitrides, silicon carbon nitrides, silicon carbonates, or a combination thereof). The conductive pad 125 is electrically connected to the TSV 115 (and to the integrated circuitry through the TSV 115). In some embodiments, the conductive pad 125 includes a second conductive material 127 (e.g., copper) and another conductive barrier layer 128 (e.g., TaN).

The conductive pad 125 depicted in diagram 100A includes a surface recessed by a depth D with respect to the surface of the dielectric layer 120. In some embodiments, CMP process steps are used to form the conductive pad 125, and the recess may be a result of the CMP process. For example, the recess may be formed during over-polishing steps that remove excessive conductive material 127 on the surface of the dielectric layer 120. Additionally, or alternatively, the amount of recess (e.g., the recess depth D) may be targeted to ensure the surface of the conductive pad 125 not to protrude above the surface of the dielectric layer 120— e.g., to avoid such protruded conductive pads 125 interfering with the bonding process described with reference to Diagram 100B. Further, the amount of recess may be targeted to be within a certain range such that the conductive materials 127 can form an interconnect 140 without compromising the bonding integrity as described with reference to Diagram 100C.

Diagram 100B illustrates two semiconductor dies 101a and 101b (or two wafers including the semiconductor dies 101a and 101b) that are attached together such that dielectric materials of the top semiconductor die 101b and bottom semiconductor die 101a adhere to each other to form dielectric-to-dielectric bonding 130 at the bonding interface 105 (which may be referred to as a bond line). In some embodiments, the dielectric surfaces are activated (e.g., using a plasma treatment process) to facilitate the bonding of the dielectric surfaces. Also, conductive pads (e.g., the top conductive pad 125b and the bottom conductive pad 125a) of the top and bottom semiconductor dies 101a and 101b are aligned to face each other but may not be connected to each other due to the recessed surfaces of the conductive pads 125a/b.

Diagram 100C illustrates that the bonded dies/wafers are annealed in an elevated temperature (e.g., around 400° C.) such that the conductive materials of the top and bottom conductive pads 125a/b may expand toward each other in response to receiving thermal energy during the post bond annealing process (e.g., due to the mismatch in CTEs between the conductive materials and the dielectric materials) within an open space defined by the recess surfaces and the dielectric material surrounding the conductive pads 125a/b.

When the surfaces of the top and bottom conductive materials are in contact, the conductive materials are conjoined (e.g., via atomic migration (intermixing, diffusion) from one conductive material to another conductive material) to form metal-to-metal bonding 135—e.g., metallurgical bonding, permanent bonding. Once the metallurgical bonding is formed between the conductive pads 125a/b (thus, forming the interconnect 140), the conductive materials do not separate (or sever) when the bonded dies/wafers are brought to the ambient temperature or operating temperatures of the semiconductor die assemblies. In this manner, the bonding interface 105 includes the dielectric-to-dielectric bonding 130 and the metal-to-metal bonding 135.

Figure 2:
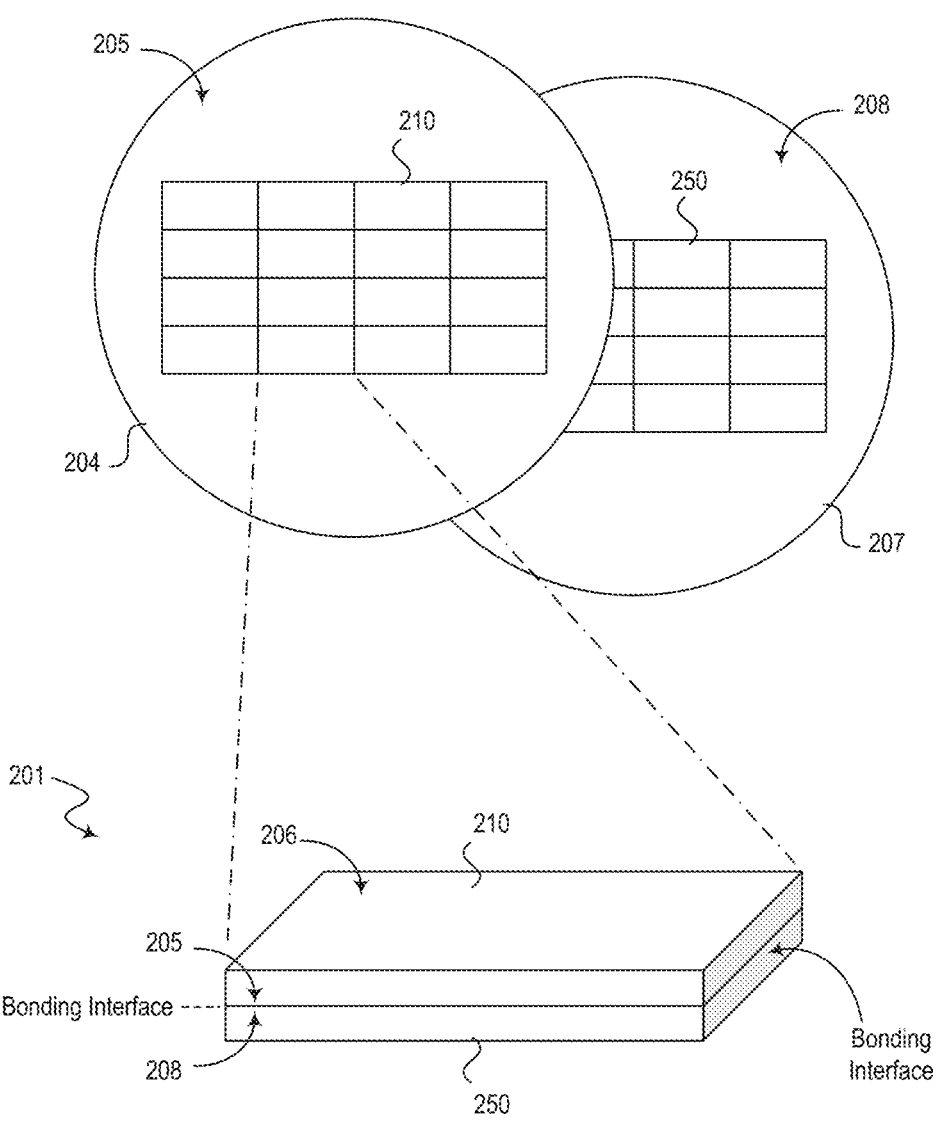
FIG. 2 illustrates two semiconductor wafers for making semiconductor die stacks in accordance with embodiments of the present technology.

FIG. 2 illustrates two semiconductor wafers 204 and 207 for making semiconductor die stacks in accordance with embodiments of the present technology. The first semiconductor wafer 204 includes a plurality of first semiconductor dies 210 on its front side 205 and the second semiconductor wafer 207 includes a plurality of second semiconductor dies 250 on its front side 208. The front sides 205 and 208 can be referred to as active sides of the semiconductor wafers, on which various structures are fabricated—e.g., integrated circuits, arrays of memory cells, conductive traces, contacts/vias, bond pads. In some embodiments, each of the second semiconductor dies 250 has the same area as each of the first semiconductor die 210. In some embodiments, the first and second semiconductor wafers 204 and 207 are generated (fabricated) using at least two different temperature schemes.

In some embodiments, the first semiconductor die 210 includes first circuitry and a plurality of first conductive components on its front side 205, where the plurality of first conductive components are coupled to the first circuitry. Similarly, the second semiconductor die 250 includes second circuitry and a plurality of second conductive components on its front side 208, where the plurality of second conductive components are coupled to the second circuitry. For example, the first circuitry includes a logic circuit with a first structure generated using a first process at a first temperature (e.g., a relatively high temperature scheme), and the second circuitry includes an array of memory cells (e.g., DRAM cells, NAND memory cells, PCM cells) with a second structure generated using a second process at a second temperature (e.g., a relatively low temperature scheme) less than the first temperature. In some embodiments, the first temperature renders the memory cells of the array non-functional if the memory cells are subject to the first temperature.

During the direct bonding process as described with reference to FIG. 1, the first semiconductor wafer 204 may be flipped and brought over the second semiconductor wafer 207 such that front sides 205 and 208 of the first and second wafers may face each other. Subsequently, the first semiconductor wafer 204 including the first semiconductor die 210 may be arranged over the second semiconductor wafer 207 including the second semiconductor die 250 (or the second semiconductor wafer 207 may be arranged over the first semiconductor wafer 204) such that each of the conductive components of the first semiconductor die 210 is aligned to a corresponding one of the conductive components of the second semiconductor die 250.

Subsequently, the first and second semiconductor wafers 204 and 207 may be bonded to each other such that each of the conductive components of the first semiconductor die 210 can be directly bonded to a corresponding one of the conductive components of the second semiconductor die 250. Moreover, a first dielectric material surrounding each of the conductive components of the first semiconductor die 210 may be directly bonded to a second dielectric material surrounding the corresponding one of the conductive components of the second semiconductor die 250 (e.g., forming the combinational bonding configuration (or the hybrid bonding configuration) described with reference to FIG. 1). Individual first and second semiconductor dies 210 and 250 may not need to be tested prior to the bonding process.

Also depicted in FIG. 2 is a single semiconductor device 201 after the bonding is complete, which includes the first and second semiconductor dies 210 and 250 bonded to each other at the bonding interface defined by the front sides 205 and 208 of the first semiconductor die 210 and the second semiconductor die 250. In this regard, the front sides 205 and 208 of the first and second semiconductor dies 210 and 250 are directly bonded such that each of the first conductive components is conjoined to a corresponding one of the second conductive components at the bonding interface. As such, the semiconductor device 201 needs pathways to provide power and signals to the first and second conductive components conjoined at the bonding interface.

In some embodiments, either the first semiconductor die 210 or the second semiconductor die 250 includes a plurality of TSVs to provide the pathways. For example, the first semiconductor die 210 includes TSVs connected to the first conductive components conjoined with the second conductive components such that both of the first and second circuitry are coupled with a plurality of bond pads on a back side 206 of the first semiconductor die 210 through the plurality of TSVs. In this regard, the first and second semiconductor dies 210 and 250 bonded to each other receive power and communicates signals through TSVs of the first semiconductor die 210.

Figure 3:
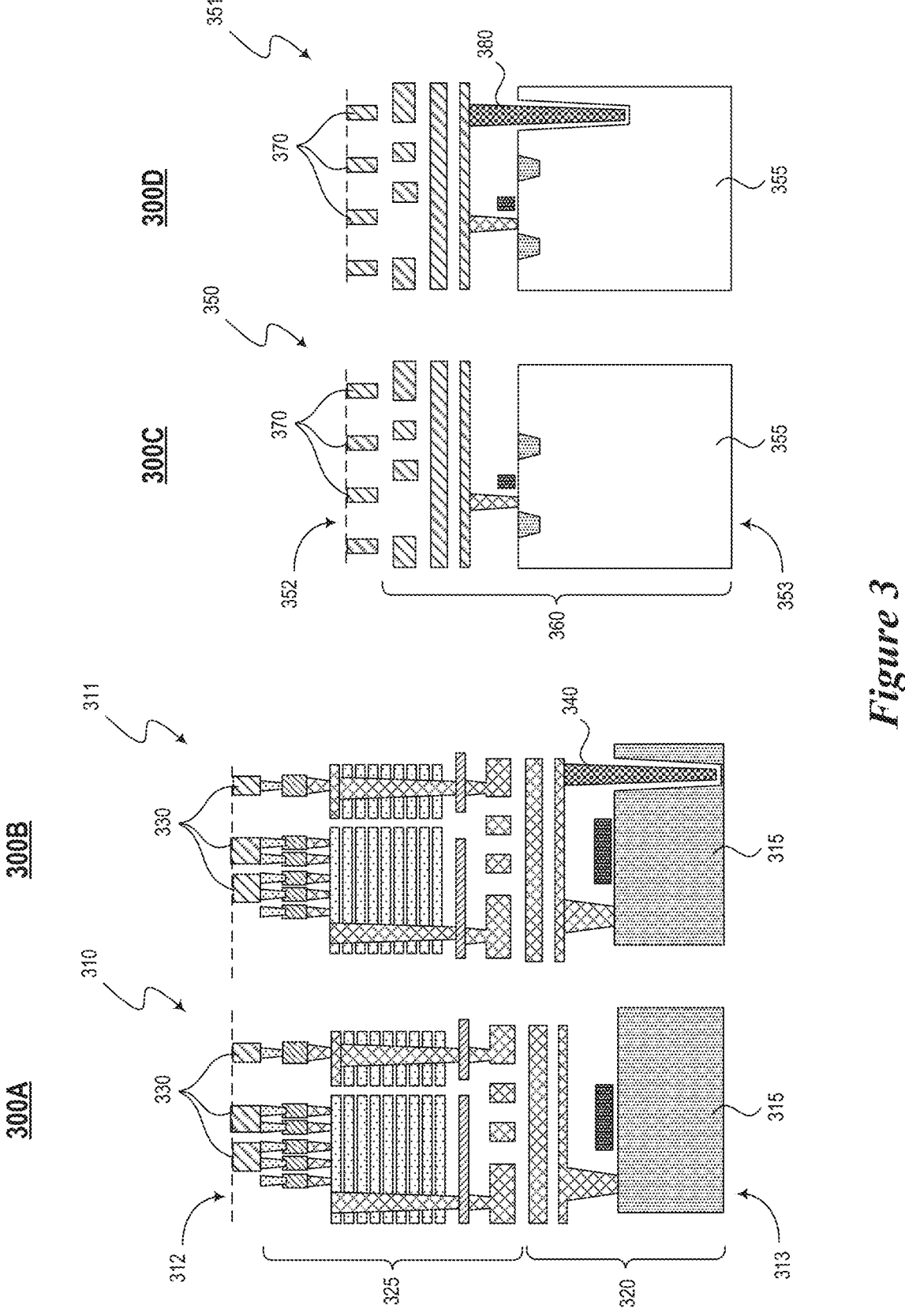
FIG. 3 illustrates semiconductor wafers for making semiconductor stacks in accordance with embodiments of the present technology.

FIG. 3 illustrates portions of semiconductor wafers for making semiconductor stacks in accordance with embodiments of the present technology. Diagram 300A is a schematic diagram depicting a portion of a semiconductor wafer including a plurality of semiconductor dies 310, where the portion corresponds to one of the semiconductor dies 310 (or a portion thereof). The semiconductor die 310 (or the semiconductor wafer including the semiconductor die 310) has a front side 312 and a back side 313 opposite to the front side 312. In some embodiments, the semiconductor die 310 includes an integrated circuit 320 and a memory array 325. The integrated circuit 320 includes various structures (e.g., transistors, contacts, conductive traces), some of which are fabricated in a semi-subs 315 (e.g., semiconductor junctions, isolation structures).

The memory array 325 may include a variety of memory cells, such as Not-AND (NAND) memory cells, dynamic random access memory (DRAM) cells, phase change memory (PCM) cells, among others. As such, the semiconductor die 310 (or the semiconductor wafer including the semiconductor dies 310) may be referred to as a memory die 310 (or a memory wafer). The semiconductor die 310 also includes a plurality of conductive components 330 (e.g., bond pads, copper pads) on the front side 312. The conductive components 330 are configured to provide power and signals to the semiconductor die 310 (e.g., the memory array 325 and the integrated circuit 320).

Diagram 300B is a schematic diagram depicting a portion of a semiconductor wafer including a plurality of semiconductor dies 311, where the portion corresponds to one of the semiconductor dies 311 (or a portion thereof). The semiconductor die 311 may be regarded as identical to the semiconductor die 310 except that the semiconductor die 311 includes a plurality of TSVs 340. The TSVs 340 are configured to be coupled to the conductive components 330 on the front side 312 of the semiconductor die 311.

Diagram 300C is a schematic diagram depicting a portion of a semiconductor wafer including a plurality of semiconductor dies 350, where the portion corresponds to one of the semiconductor dies 350 (or a portion thereof). The semiconductor die 350 (or the semiconductor wafer including the semiconductor die 350) has a front side 352 and a back side 353 opposite to the front side 352. In some embodiments, the semiconductor die 350 includes an integrated circuit 360 that includes various structures (e.g., transistors, contacts, conductive traces), some of which are fabricated in a semi-subs 355 (e.g., semiconductor junctions, isolation structures).

The integrated circuit 360 may be configured to performs various logic operations, such as digital operations, analog operations, analog-to-digital conversion (ADC) operations, digital-to-analog (DAC) operations, or the like. As such, the semiconductor die 350 (or the semiconductor wafer including the semiconductor dies 350) may be referred to as a logic die 350 (or a logic wafer). The semiconductor die 350 also includes a plurality of conductive components 370 (e.g., bond pads, copper pads) on the front side 352. The conductive components 370 are configured to provide power and signals to the semiconductor die 350 (e.g., the integrated circuit 360).

Diagram 300D is a schematic diagram depicting a portion of a semiconductor wafer including a plurality of semiconductor dies 351, where the portion corresponds to one of the semiconductor dies 351 (or a portion thereof). The semiconductor die 351 may be regarded as identical to the semiconductor die 350 except that the semiconductor die 351 includes a plurality of TSVs 380. The TSVs 380 are configured to be coupled to the conductive components 370 on the front side 352 of the semiconductor die 351.

As described in more details herein, the present technology facilitates combining at least two different semiconductor dies (or two semiconductor wafers including the semiconductor dies) with at least two different primary functions (e.g., logic function and memory function (data/information storage)) after completing their fabrication process, process steps to fabricate each semiconductor dies can be optimized independent of each other. For example, the process steps fabricating the logic die 350/351 (e.g., the integrated circuit 360) can be optimized independent of the process steps fabricating the memory dies 310/311 (e.g., the array of memory cells 325). In some cases, some of the process steps may be mutually exclusive—e.g., certain process steps optimized for fabricating the logic die 350/351 (or the integrated circuit 360) may deteriorate or destroy the functionality of memory dies 310/311 or vice versa.

In some embodiments, the integrated circuit 360 includes a first structure generated using a first process at a first temperature. For example, the integrated circuit 360 include junctions with a junction depth of 0.1 micrometers (μm) or greater, which may require thermally annealing the logic die 306 (or the logic wafer including the logic dies 306) at an elevated temperature (e.g., 900° C., 1000° C., or even higher temperature). Additionally, or alternatively, the integrated circuit 360 may include a silicide layer formed on certain semiconductor regions (e.g., poly-silicon gates, source/drain regions) for reducing resistance, which may require process temperature reaching approximately 600° C. or greater. In some cases, the integrated circuit 360 includes an epitaxial layer formed at temperature around 1200° C.

In some embodiments, the memory dies 310/311 (e.g., the array of memory cells 325) includes a second structure generated using a second process at a second temperature that is less than the first temperature. For example, the memory cells of the array may include a data storage structure including a chalcogenide compound formed at around 400° C. or a dielectric material with a dielectric constant greater than that of silicon dioxide ($SiO_2$). In some embodiments, the first temperature renders the memory cells of the array of memory cells 325 non-functional if the memory cells are subject to the first temperature.

Figure 4A:
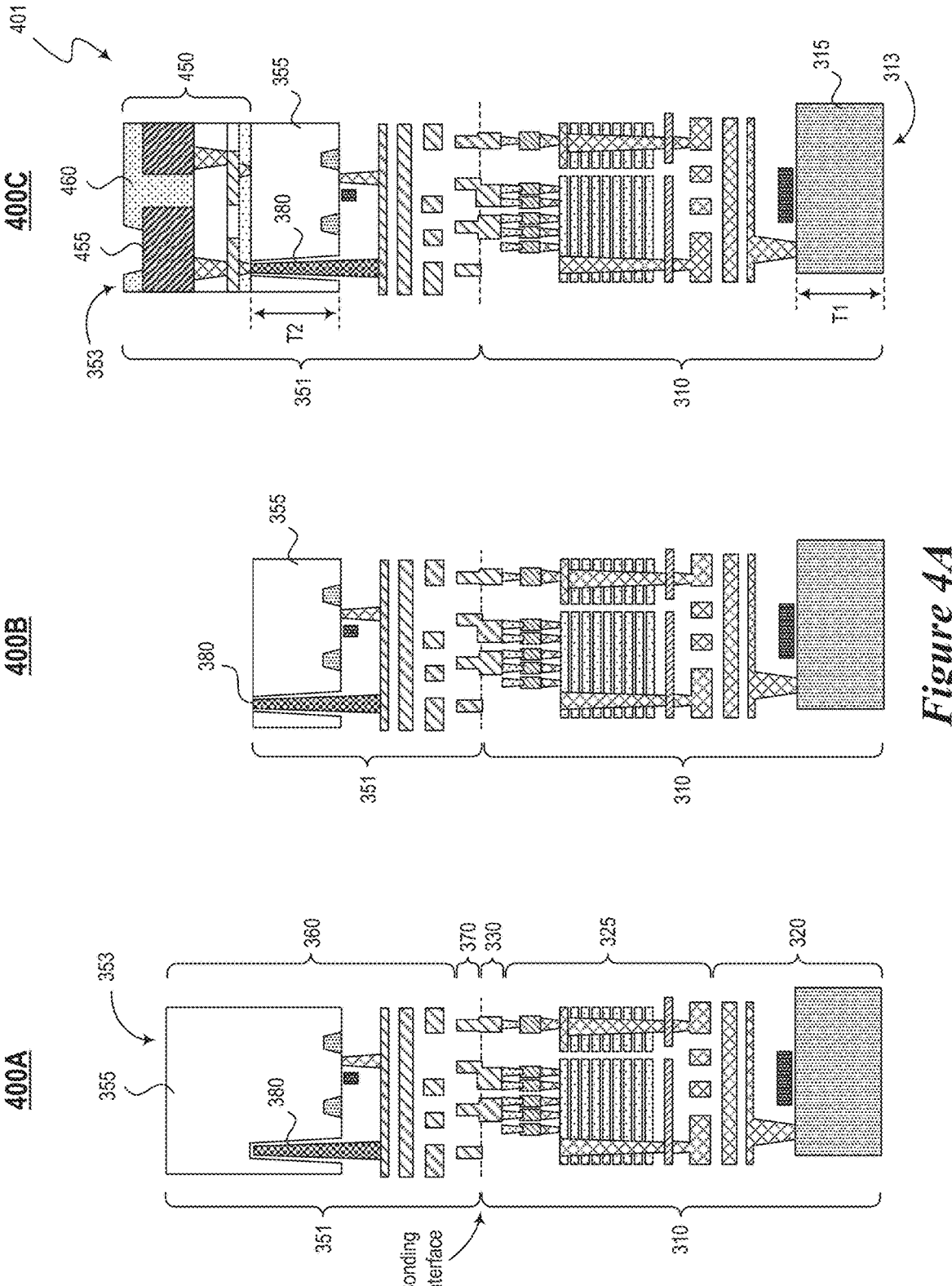
FIGS. 4A-4D illustrate options of making semiconductor die stacks in accordance with embodiments of the present technology.

FIGS. 4A-4D illustrate options of making semiconductor die stacks in accordance with embodiments of the present technology. FIG. 4A includes diagrams 400A-400C depicting stages of making the semiconductor die stacks. The diagram 400A is a schematic diagram depicting a semiconductor wafer including a plurality of semiconductor dies 310, which is directly bonded to another semiconductor wafer including a plurality of semiconductor dies 351 at the bonding interface defined by the front side 312 of the semiconductor dies 310 and the front side 352 of the semiconductor dies 351—e.g., using the direct bonding process described with reference to FIG. 1. Moreover, the conductive components 330 are conjoined to corresponding conductive components 370 at the bonding interface. In some instances, some of the conductive components 330 or 370 may not have conductive components to be conjoined with. As a result of conjoining (connecting) the conductive components 370 with the conductive components 330, the integrated circuit 360 (e.g., the logic circuit) of the semiconductor die 351 is connected to the array of memory cells 325 (and the integrated circuit 320) of the semiconductor die 310.

The diagrams 400B and 400C illustrate making external connections for the conjoined conductive components 330/370 located at the bonding interface. The diagram 400B illustrates that a portion of the substrate 355 of the semiconductor die 351 has been removed (e.g., polished away, etched away) from the back side 353 to expose a portion of the TSV 380. Subsequently, as depicted in the diagram 400C, various interconnect structures can be generated in a dielectric layer 450. For example, the dielectric layer 450 may include a bonding pad 455 and a final passivation structure 460. As the bonding pad 455 is connected to the TSV 380, which in turn, is connected to the conjoined conductive components 330/370, the bonding pad 455 can be regarded as a terminal for the resulting semiconductor device 401 (i.e., the semiconductor dies 351 and 310 bonded to each other). In this manner, power and electrical signal can be provided for both of the semiconductor dies 351 and 310 through the bonding pad 455. The resulting device 401 may be an example of or include aspects of the memory device 201 described with reference to FIG. 2.

In some embodiments, the substrate 315 of the semiconductor die 310 has a thickness (T1) different than a thickness (T2) of the substrate 355 of the semiconductor die 351. For example, the thickness T1 of the memory die 310 may be less than the thickness T2 of the logic die 351. In some embodiments, a bonding wire may be attached to the bonding pad 455, which is configured to connect the bonding pad 455 to a substrate bonding pad of a package substrate (not shown)—e.g., a (face-up) bonding wire scheme. In such embodiments, the back side 313 of the semiconductor die 310 may be attached to the package substrate (e.g., with an adhesive film). In some embodiments, a ball of a ball grid array (BGA) may be formed on the bonding pad 455. In such embodiments, the semi-dev 401 may be flipped such that the back side 353 of the semiconductor die 351 can be attached to the package substrate through the ball—e.g., a (face-down) flip-chip attachment scheme.

In some embodiments, during operation of the semiconductor device including the bonded pair of semiconductor dies (e.g., the semiconductor device 401), one semiconductor die may generate more heat than the other semiconductor die. Moreover, a semiconductor package configured to house the semiconductor device may include certain heat sink structures devised to facilitate transferring of the heat from the bonded pair to dissipate the thermal energy. The present technology provides flexibility as to how to arrange the semiconductor device in relation to the heat sink structure of the semiconductor package.

For example, if the logic die 351 generates more heat than the memory die 310 and the package substrate includes a heat sink structure configured to dissipate the thermal energy from the semiconductor device, the flip-chip attachment scheme may be advantageous from the thermal efficiency viewpoints such that the logic die 351 can be located proximate to the heat sink structure through the balls attached to the bonding pads 455. Conversely, if the memory die 310 generates more heat than the logic die 351 and the package substrate includes the heat sink structure, the bonding wire scheme may be advantageous from the thermal efficiency viewpoints such that the memory die 310 can be located proximate to the heat sink structure via the adhesive film (which can be configured to be thermally conductive).

Figure 4B:
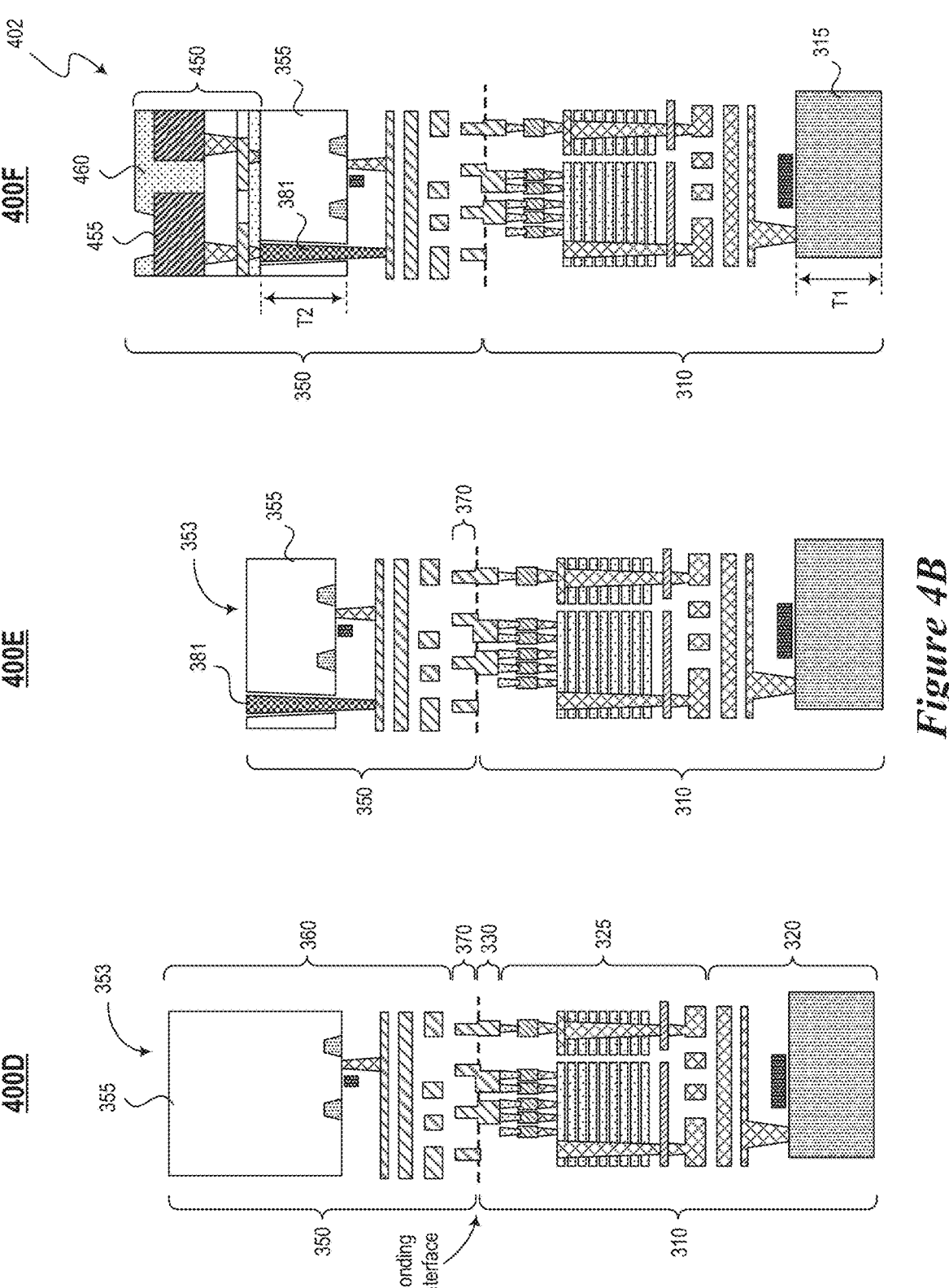

FIG. 4B includes diagrams 400D-400F depicting stages of making the semiconductor die stacks. The diagram 400D is a schematic diagram depicting a semiconductor wafer including a plurality of semiconductor dies 310, which is directly bonded to another semiconductor wafer including a plurality of semiconductor dies 350 at the bonding interface defined by the front side 312 of the semiconductor dies 310 and the front side 352 of the semiconductor dies 350. As described with reference to FIG. 4A, the conductive components 330 are conjoined to corresponding conductive components 370 at the bonding interface. As a result of conjoining (connecting) the conductive components 370 with the conductive components 330, the integrated circuit 360 (e.g., the logic circuit) of the semiconductor die 350 is connected to the array of memory cells 325 (and the integrated circuit 320) of the semiconductor die 310.

The diagrams 400E and 400F illustrate making external connections for the conjoined conductive components 330/370 located at the bonding interface. The diagram 400E illustrates that a portion of the substrate 355 of the semiconductor die 350 has been removed (e.g., polished away, etched away) from the back side 353 to reduce the thickness of the substrate 355. Subsequently, the TSV 381 can be formed from the back side 353 such that the TSV 381 connects to the conductive components 370. Subsequently, various interconnect structures (e.g., the bonding pad 455 and the final passivation structure 460 in the dielectric layer 450) can be formed to connect the TSV 381 to the bonding pad 455. As the bonding pad 455 is connected to the TSV 381, which in turn, is connected to the conjoined conductive components 330/370, the bonding pad 455 can be regarded as a terminal for the resulting semiconductor device 402 (i.e., the semiconductor dies 350 and 310 bonded to each other). In this manner, power and electrical signal can be provided for both of the semiconductor dies 350 and 310 through the bonding pad 455. The resulting device 402 may be an example of or include aspects of the memory device 201 described with reference to FIG. 2

In some embodiments, the substrate 315 of the semiconductor die 310 has a thickness (T1) different than a thickness (T2) of the substrate 355 of the semiconductor die 350. For example, the thickness T1 of the memory die 310 may be less than the thickness T2 of the logic die 350. As described with the semiconductor device 401 with reference to FIG. 4A, a bonding wire may be attached to the bonding pad 455 in some embodiments. In other embodiments, a ball of a ball grid array (BGA) may be formed on the bonding pad 455 for the flip-chip attachment scheme.

Figure 4C:
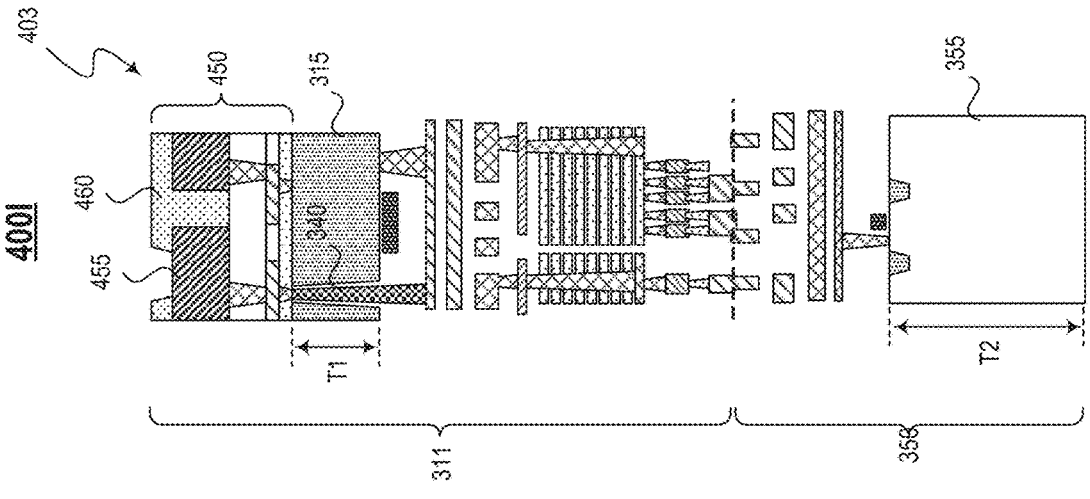
Figure 4C:
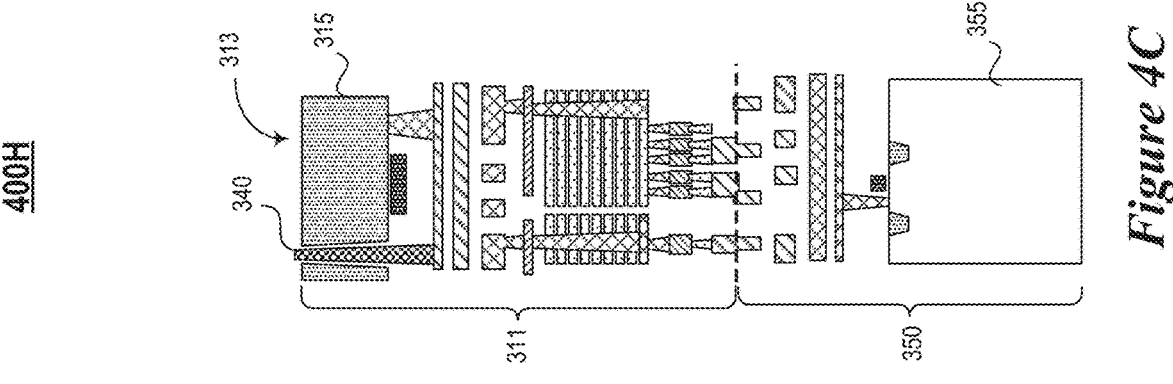
Figure 4C:
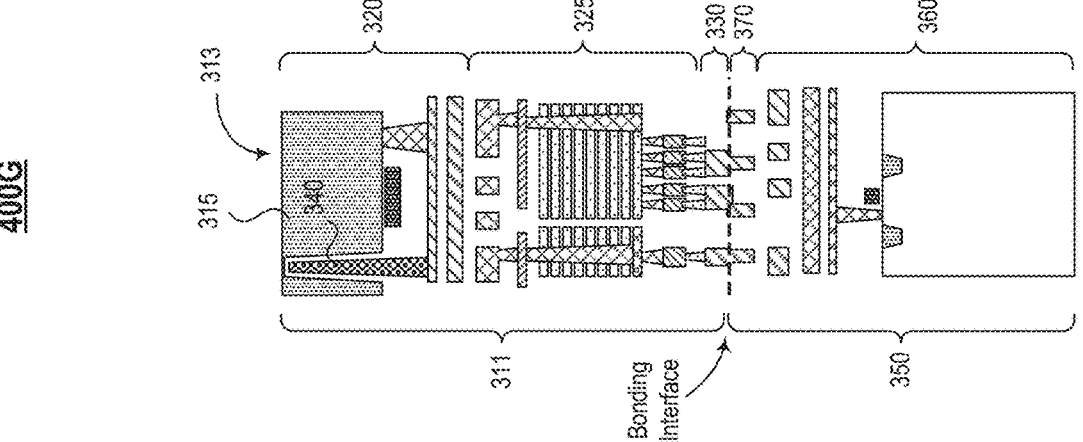

FIG. 4C includes diagrams 400G-400I depicting stages of making the semiconductor die stacks. The diagram 400G is a schematic diagram depicting a semiconductor wafer including a plurality of semiconductor dies 350, which is directly bonded to another semiconductor wafer including a plurality of semiconductor dies 311 at the bonding interface defined by the front side 312 of the semiconductor dies 311 and the front side 352 of the semiconductor dies 350. As described with reference to FIG. 4A, the conductive components 330 are conjoined to corresponding conductive components 370 at the bonding interface. As a result of conjoining (connecting) the conductive components 370 with the conductive components 330, the integrated circuit 360 (e.g., the logic circuit) of the semiconductor die 350 is connected to the array of memory cells 325 (and the integrated circuit 320) of the semiconductor die 311.

The diagrams 400H and 400I illustrate making external connections for the conjoined conductive components 330/370 located at the bonding interface. The diagram 400H illustrates that a portion of the substrate 315 of the semiconductor die 311 has been removed (e.g., polished away, etched away) from the back side 313 to expose a portion of the TSV 340. Subsequently, various interconnect structures (e.g., the bonding pad 455 and the final passivation structure 460 in the dielectric layer 450) can be formed to connect the TSV 340 to the bonding pad 455. As the bonding pad 455 is connected to the TSV 340, which in turn, is connected to the conjoined conductive components 330/370, the bonding pad 455 can be regarded as a terminal for the resulting semiconductor device 403 (i.e., the semiconductor dies 350 and 311 bonded to each other). In this manner, power and electrical signal can be provided for both of the semiconductor dies 350 and 311 through the bonding pad 455. The resulting device 403 may be an example of or include aspects of the memory device 201 described with reference to FIG. 2.

In some embodiments, the substrate 315 of the semiconductor die 311 has a thickness (T1) different than a thickness (T2) of the substrate 355 of the semiconductor die 350. For example, the thickness T1 of the memory die 311 may be less than the thickness T2 of the logic die 350. As described with the semiconductor device 401 with reference to FIG. 4A, a bonding wire may be attached to the bonding pad 455 in some embodiments. In other embodiments, a ball of a ball grid array (BGA) may be formed on the bonding pad 455 for the flip-chip attachment scheme.

Figure 4D:
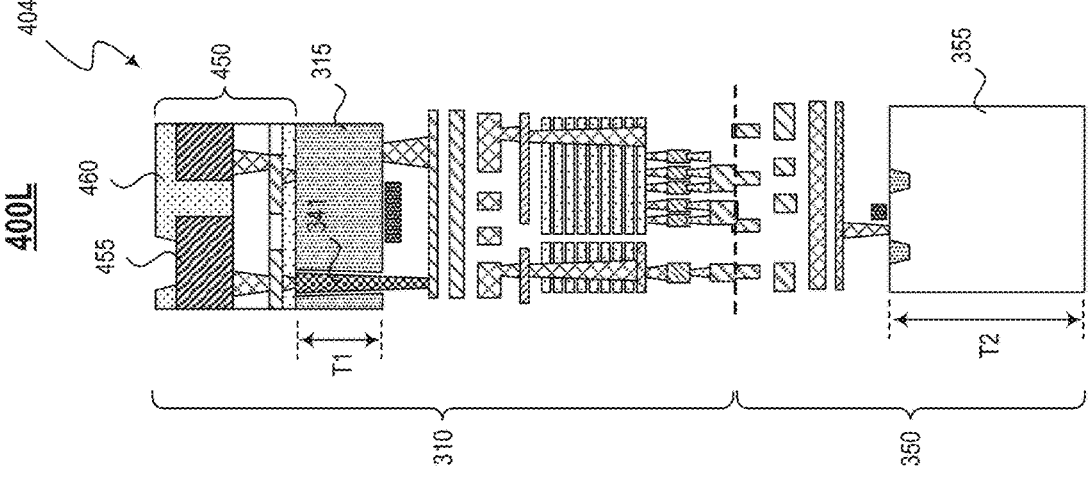
Figure 4D:
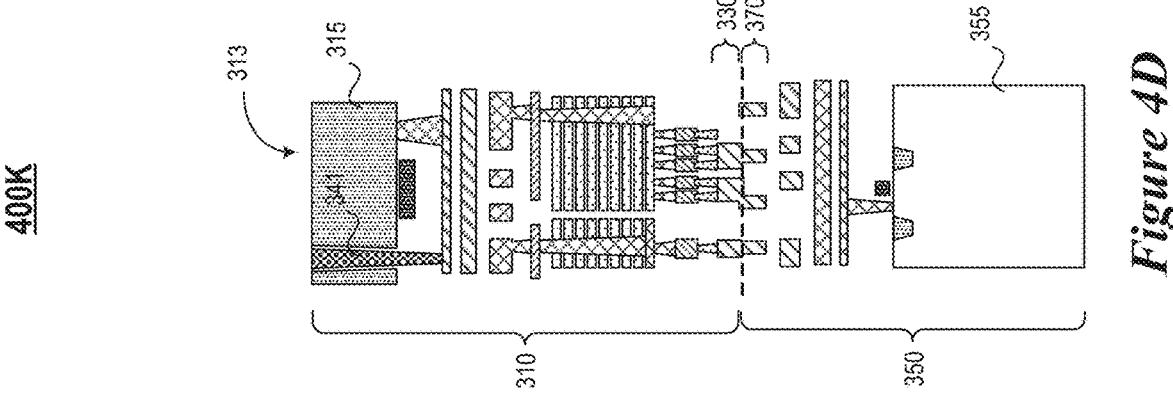
Figure 4D:
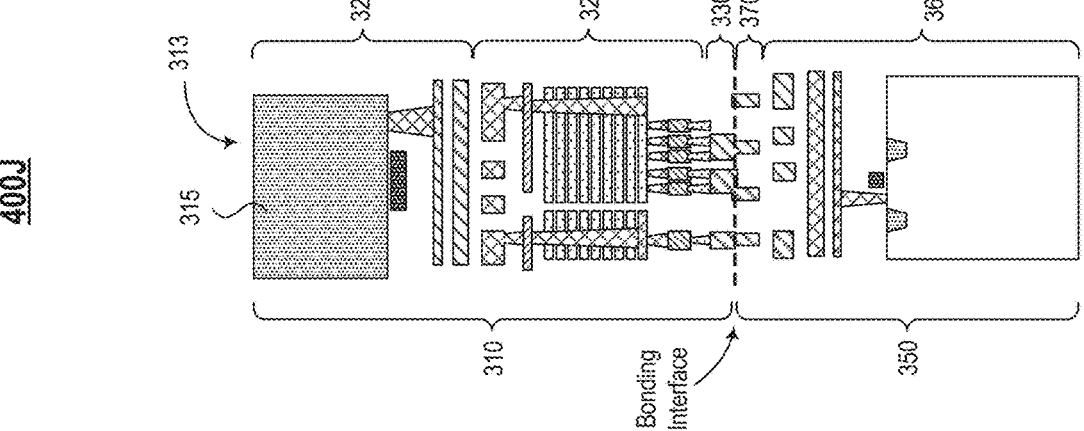

FIG. 4D includes diagrams 400J-400L depicting stages of making the semiconductor die stacks. The diagram 400J is a schematic diagram depicting a semiconductor wafer including a plurality of semiconductor dies 310, which is directly bonded to another semiconductor wafer including a plurality of semiconductor dies 350 at the bonding interface defined by the front side 312 of the semiconductor dies 310 and the front side 352 of the semiconductor dies 350. As described with reference to FIG. 4A, the conductive components 330 are conjoined to corresponding conductive components 370 at the bonding interface. As a result of conjoining (connecting) the conductive components 370 with the conductive components 330, the integrated circuit 360 (e.g., the logic circuit) of the semiconductor die 350 is connected to the array of memory cells 325 (and the integrated circuit 320) of the semiconductor die 310.

The diagrams 400K and 400L illustrate making external connections for the conjoined conductive components 330/370 located at the bonding interface. The diagram 400K illustrates that a portion of the substrate 315 of the semiconductor die 310 has been removed (e.g., polished away, etched away) from the back side 313 to reduce the thickness of the substrate 315. Subsequently, the TSV 341 can be formed from the back side 313 such that the TSV 341 connects to the conductive components 330. Subsequently, various interconnect structures (e.g., the bonding pad 455 and the final passivation structure 460 in the dielectric layer 450) can be formed to connect the TSV 341 to the bonding pad 455. As the bonding pad 455 is connected to the TSV 341, which in turn, is connected to the conjoined conductive components 330/370, the bonding pad 455 can be regarded as a terminal for the resulting semiconductor device 404 (i.e., the semiconductor dies 350 and 310 bonded to each other). In this manner, power and electrical signal can be provided for both of the semiconductor dies 350 and 310 through the bonding pad 455. The resulting device 404 may be an example of or include aspects of the memory device 201 described with reference to FIG. 2.

In some embodiments, the substrate 315 of the semiconductor die 310 has a thickness (T1) different than a thickness (T2) of the substrate 355 of the semiconductor die 350. For example, the thickness T1 of the memory die 310 may be less than the thickness T2 of the logic die 350. As described with the semiconductor device 401 with reference to FIG. 4A, a bonding wire may be attached to the bonding pad 455 in some embodiments. In other embodiments, a ball of a ball grid array (BGA) may be formed on the bonding pad 455 for the flip-chip attachment scheme.

The example embodiments described with reference to FIGS. 4C and 4D include TSVs 340/341 formed in the memory dies 310/311. As described herein, the memory die 310 may include structures generated in relatively low temperature (low-temperature regime materials)—e.g., a data storage structure including a chalcogenide compound formed at around 400° C. or a dielectric material with a dielectric constant greater than that of silicon dioxide ($SiO_2$). As the low-temperature regime materials may be sensitive to subsequent thermal cycles, forming TSVs 340/341 in the memory die 310 may have adverse effects to the array of memory cells 325. Accordingly, the example embodiments described with reference to FIGS. 4A and 4B, which forms the TSVs 380/381 in the logic dies 350/351 may be more advantageous in comparison to the embodiments of FIGS. 4C and 4D to maintain integrity of the memory cells of the memory dies 310/311.

The example embodiments described with reference to FIGS. 4A and 4C may be referred to as a TSV-first scheme in view of the TSVs 340/380 formed in one semiconductor die of the bonded semiconductor die pair prior to bonding the two wafers. The example embodiments described with reference to FIGS. 4B and 4D may be referred to as a TSV-last scheme in view of the TSV 341/381 formed after bonding the two wafers. As the TSVs 341/381 are formed from the polished back side 313/353 of the substrate 315/355 in the TSV-last scheme, precise placements of the TSVs 341/381 may be difficult. Accordingly, design rules associated with the TSVs 341/381 (e.g., registration rules with respect to underlying layers for the TSVs 341/381 to land on, spacing between the TSVs 341/381) may be relaxed when compared to the design rules associated with the TSVs 340/381 of the TSV-first scheme.

Figure 5:
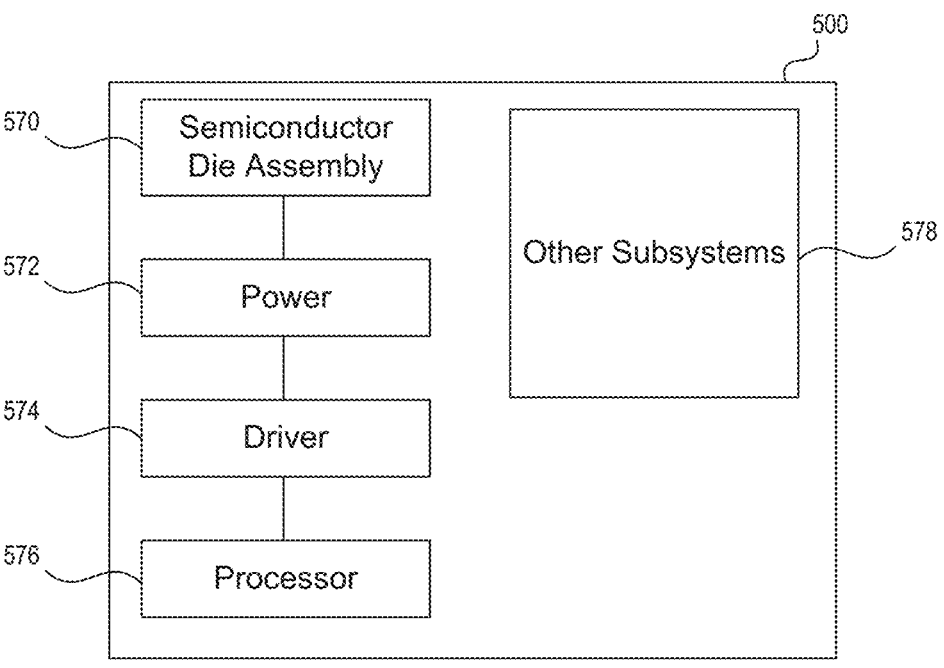
FIG. 5 is a block diagram schematically illustrating a system including a semiconductor die assembly in accordance with embodiments of the present technology.

FIG. 5 is a block diagram schematically illustrating a system 500 including a semiconductor die assembly in accordance with embodiments of the present technology. The system 500 can include a semiconductor device assembly 570, a power source 572, a driver 574, a processor 576, and/or other subsystems or components 578. The semiconductor device assembly 570 can be incorporated into any of a myriad of larger and/or more complex systems, a representative example of which is the system 500 shown schematically in FIG. 5. The semiconductor die assembly (e.g., semiconductor die stacks, semiconductor die pairs) described with reference to FIGS. 2, 3, and 4A-4D may be included in the semiconductor device assembly 570 of the system 500.

The semiconductor device assembly 570 can have features generally similar to the semiconductor die assembly described herein with reference to FIGS. 2, 3, and 4A-4D. For example, the semiconductor device assembly 570 may include a logic die including logic circuitry, wherein the logic die includes a plurality of first conductive pads on a front side of the logic die, the plurality of first conductive pads coupled to the logic circuitry, and a memory die including an array of memory cells, wherein the memory die includes a plurality of second conductive pads on a front side of the memory die, the plurality of second conductive pads coupled to the array of memory cells, where the front sides of the logic die and the memory die are directly bonded such that each of the first conductive pads is conjoined to a corresponding one of the second conductive pads at a bonding interface defined by the front sides of the first and second semiconductor dies, and the logic die includes a plurality of TSVs connected to the plurality of first conductive pads such that the logic circuitry and the array of memory cells are coupled to a plurality of bond pads on a back side of the logic die through the plurality of TSVs.

In some embodiments, the logic circuitry includes a first structure generated using a first process at a first temperature, the first structure having one of a silicide, an epitaxial layer, or a junction with a junction depth greater than 0.1 micrometers (μm). In some embodiments, the array of memory cells includes a second structure generated using a second process at a second temperature less than the first temperature, the second structure having one of a chalcogenide compound, a silicate, an inter-poly dielectric layer, a charge trap layer or a dielectric material with a dielectric constant greater than that of silicon dioxide ($SiO_2$). In some embodiments, the first temperature renders the memory cells of the array non-functional if the memory cells are subject to the first temperature.

The resulting system 500 can perform any of a wide variety of functions, such as memory storage, data processing, and/or other suitable functions. Accordingly, representative systems 500 can include, without limitation, handheld devices (e.g., mobile phones, tablets, digital readers, and digital audio players), computers, and appliances. Components of the system 500 may be housed in a single unit or distributed over multiple, interconnected units (e.g., through a communications network). The components of the system 500 can also include remote devices and any of a wide variety of computer readable media.

FIG. 6 is a flowchart of a method of forming semiconductor die assemblies in accordance with embodiments of the present technology. The flowchart 600 may include aspects of methods as described with reference to FIGS. 2, 3, and 4A-4D.

The method comprises providing a first wafer including a plurality of first semiconductor dies, each of the first semiconductor dies including a plurality of first conductive components on a front side of the first wafer, the plurality of first conductive components coupled to the first circuitry (box 610). The method further comprises providing a second wafer including a plurality of second semiconductor dies, each of the second semiconductor dies including a plurality of second conductive components on a front side of the second wafer, the plurality of second conductive components coupled to the second circuitry (box 615). The method further comprises bonding the first wafer to the second wafer to form a bonding interface therebetween, where each of the first conductive components is conjoined to a corresponding one of the second conductive components at the bonding interface, and each of the first semiconductor dies includes a plurality of TSVs connected to the plurality of first conductive components such that both the first circuitry and the second circuitry are coupled to a plurality of bond pads on a back side of each of the first semiconductor die through the plurality of TSVs (box 620).

In some embodiments, the plurality of TSVs are formed from the front side of the first wafer prior to bonding the first wafer to the second wafer, and the plurality of first conductive components are formed to connect to the plurality of TSVs present on the front side of the first wafer. In some embodiments, the method further comprises polishing, after bonding the first wafer to the second wafer, a back side of the first wafer to expose portions of the TSVs from the back side of the first wafer. In some embodiments, the method further comprises forming conductive structures connected to the exposed portions of the TSVs, such that the plurality of bond pads are formed to connect to the exposed portions of the TSVs through the conductive structures.

In some embodiments, the plurality of TSVs are formed from a back side of the first wafer after bonding the first wafer to the second wafer, and the plurality of TSVs are formed to connect to the plurality of first conductive components present on the front side of the first wafer. In some embodiments, the method further comprises polishing, after bonding the first wafer to the second wafer, the back side of the first wafer, wherein the TSVs are formed from the polished back side of the first wafer.

It should be noted that the methods described above describe possible implementations, and that the operations and the steps may be rearranged or otherwise modified and that other implementations are possible. Furthermore, embodiments from two or more of the methods may be combined. From the foregoing, it will be appreciated that specific embodiments of the technology have been described herein for purposes of illustration, but that various modifications may be made without deviating from the disclosure. In addition, while in the illustrated embodiments certain features or components have been shown as having certain arrangements or configurations, other arrangements and configurations are possible. Moreover, certain aspects of the present technology described in the context of particular embodiments may also be combined or eliminated in other embodiments.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." The term "exemplary" used herein means "serving as an example, instance, or illustration," and not "preferred" or "advantageous over other examples."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor die assembly, comprising:
a first semiconductor die including first circuitry, wherein the first semiconductor die includes a plurality of first conductive components on a front side of the first semiconductor die, the plurality of first conductive components coupled to the first circuitry; and
a second semiconductor die including second circuitry, wherein the second semiconductor die includes a plurality of second conductive components on a front side of the second semiconductor die, the plurality of second conductive components coupled to the second circuitry, and wherein;

the front sides of the first and second semiconductor dies are directly bonded such that each of the first conductive components is conjoined to a corresponding one of the second conductive components at a bonding interface defined by the front sides of the first and second semiconductor dies; and the first semiconductor die includes a plurality of through-substrate vias (TSVs) connected to the plurality of first conductive components such that both of the first and second circuitry are coupled with a plurality of bond pads on a back side of the first semiconductor die through the plurality of TSVs, wherein a first one of the first circuitry and the second circuitry includes a logic circuit with a first structure generated using a first process at a first temperature, and wherein a second one of the first circuitry and the second circuitry includes an array of memory cells with a second structure generated using a second process at a second temperature less than the first temperature.

2. The semiconductor die assembly of claim 1, wherein the first semiconductor die includes a first semiconductor substrate with a first thickness and the second semiconductor die includes a second semiconductor substrate with a second thickness different than the first thickness.

3. The semiconductor die assembly of claim 1, wherein a first dielectric material surrounding each of the first conductive components is directly bonded to a second dielectric material surrounding each of the second conductive components.

4. The semiconductor die assembly of claim 1, wherein the first temperature renders the memory cells of the array non-functional if the memory cells are subject to the first temperature.

5. The semiconductor die assembly of claim 1 wherein:
the first structure includes one of a silicide, an epitaxial layer, or a junction with a junction depth greater than 0.1 micrometers (μm); and
the second structure includes one of a chalcogenide compound or a dielectric material with a dielectric constant greater than that of silicon dioxide (SiO2).

6. The semiconductor die assembly of claim 1, wherein the plurality of TSVs are formed on the front side of the first semiconductor die prior to bonding the front sides of the first and second semiconductor dies, and wherein the plurality of first conductive components are configured to connect to the plurality of TSVs present on the front side of the first semiconductor die.

7. The semiconductor die assembly of claim 1, wherein the plurality of TSVs are formed on the back side of the first semiconductor die after bonding the front sides of the first and second semiconductor dies, and wherein the plurality of TSVs are configured to connect to the plurality of first conductive components present on the front side of the first semiconductor die.

8. The semiconductor die assembly of claim 1, wherein the plurality of TSVs are formed on the front side of the first semiconductor die prior to bonding the front sides of the first and second semiconductor dies, and wherein the plurality of first conductive components are configured to connect to the plurality of TSVs present on the front side of the first semiconductor die.

9. The semiconductor die assembly of claim 1, wherein the plurality of TSVs are formed on the back side of the first semiconductor die after bonding the front sides of the first and second semiconductor dies, and wherein the plurality of TSVs are configured to connect to the plurality of first conductive components present on the front side of the first semiconductor die.

10. A method comprising:

providing a first wafer including a plurality of first semiconductor dies, each of the first semiconductor dies including a plurality of first conductive components on a front side of the first wafer, the plurality of first conductive components coupled to first circuitry;

providing a second wafer including a plurality of second semiconductor dies, each of the second semiconductor dies including a plurality of second conductive components on a front side of the second wafer, the plurality of second conductive components coupled to second circuitry;

bonding the first wafer to the second wafer to form a bonding interface therebetween, wherein:

each of the first conductive components is conjoined to a corresponding one of the second conductive components at the bonding interface; and each of the first semiconductor dies includes a plurality of through-substrate vias (TSVs) connected to the plurality of first conductive components such that both the first circuitry and the second circuitry are coupled to a plurality of bond pads on a back side of each of the first semiconductor die through the plurality of TSVs polishing, after bonding the first wafer to the second wafer, a back side of the first wafer to expose portions of the TSVs from the back side of the first wafer, wherein the plurality of TSVs are formed from the front side of the first wafer prior to bonding the first wafer to the second wafer, and wherein the plurality of first conductive components are formed to connect to the plurality of TSVs present on the front side of the first wafer.

11. The method of claim 10, further comprising:

forming conductive structures connected to the exposed portions of the TSVs, such that the plurality of bond pads are formed to connect to the exposed portions of the TSVs through the conductive structures.

12. A method comprising:

providing a first wafer including a plurality of first semiconductor dies, each of the first semiconductor dies including a plurality of first conductive components on a front side of the first wafer, the plurality of first conductive components coupled to first circuitry;

providing a second wafer including a plurality of second semiconductor dies, each of the second semiconductor dies including a plurality of second conductive components on a front side of the second wafer, the plurality of second conductive components coupled to second circuitry;

bonding the first wafer to the second wafer to form a bonding interface therebetween, wherein:

each of the first conductive components is conjoined to a corresponding one of the second conductive components at the bonding interface; and each of the first semiconductor dies includes a plurality of through-substrate vias (TSVs) connected to the plurality of first conductive components such that both the first circuitry and the second circuitry are coupled to a plurality of bond pads on a back side of each of the first semiconductor die through the plurality of TSVs, the plurality of TSVs are formed from a back side of the first wafer after bonding the first wafer to the second wafer, and the plurality of TSVs are formed to connect to the plurality of first conductive components present on the front side of the first wafer.

13. The method of claim 12, further comprising:

polishing, after bonding the first wafer to the second wafer, the back side of the first wafer, wherein the TSVs are formed from the polished back side of the first wafer.

14. A semiconductor die assembly, comprising:

a logic die including logic circuitry, wherein the logic die includes a plurality of first conductive pads on a front side of the logic die, the plurality of first conductive pads coupled to the logic circuitry; and a memory die including an array of memory cells, wherein the memory die includes a plurality of second conductive pads on a front side of the memory die, the plurality of second conductive pads coupled to the array of memory cells, and wherein;

the front sides of the logic die and the memory die are directly bonded such that each of the first conductive pads is conjoined to a corresponding one of the second conductive pads at a bonding interface defined by the front sides of the first and second semiconductor dies; and the logic die includes a plurality of through-substrate vias (TSVs) connected to the plurality of first conductive pads such that the logic circuitry and the array of memory cells are coupled to a plurality of bond pads on a back side of the logic die through the plurality of TSVs, wherein the logic circuitry includes a first structure generated using a first process at a first temperature, and wherein the array of memory cells includes a second structure generated using a second process at a second temperature less than the first temperature.

15. The semiconductor die assembly of claim 14, wherein:

the first structure includes one of a silicide, an epitaxial layer, or a junction with a junction depth greater than 0.1 micrometers (μm); and the second structure includes one of a chalcogenide compound, a silicate, an inter-poly dielectric layer, a charge trap layer or a dielectric material with a dielectric constant greater than that of silicon dioxide (SiO2).

16. The semiconductor die assembly of claim 14, wherein the first temperature renders the memory cells of the array non-functional if the memory cells are subject to the first temperature.

* * * * *